(12) United States Patent
Morikawa

(10) Patent No.: US 6,836,175 B2
(45) Date of Patent: Dec. 28, 2004

(54) SEMICONDUCTOR INTEGRATED CIRCUIT WITH SLEEP MEMORY

(75) Inventor: Koichi Morikawa, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/638,304

(22) Filed: Aug. 12, 2003

(65) Prior Publication Data

US 2004/0108884 A1 Jun. 10, 2004

(30) Foreign Application Priority Data

Dec. 6, 2002 (JP) ........................................ 2002-354727

(51) Int. Cl.⁷ .............................................. H03K 3/01
(52) U.S. Cl. ...................................................... 327/534
(58) Field of Search ................................ 327/530, 534, 327/535, 537, 538, 543, 564, 565, 566

(56) References Cited

U.S. PATENT DOCUMENTS

| | | | | |
|---|---|---|---|---|
| 5,646,900 A | * | 7/1997 | Tsukude et al. | 365/205 |
| 6,031,778 A | * | 2/2000 | Makino et al. | 365/226 |
| 6,049,245 A | * | 4/2000 | Son et al. | 327/544 |
| 6,570,439 B2 | * | 5/2003 | Berthold | 327/544 |

FOREIGN PATENT DOCUMENTS

JP  11-112297  4/1999

OTHER PUBLICATIONS

Satoshi Shigematsu, et al., "A 1–V High–Speed MTCMOS Circuit Scheme for Power–Down Application Circuits," IEEE Journal of Solid–State Circuits, vol. 32, No. 6, Jun. 1997, pp. 261–869.

* cited by examiner

Primary Examiner—Jeffrey Zweizig
(74) Attorney, Agent, or Firm—Volentine Francos & Whitt, PLLC

(57) ABSTRACT

A semiconductor integrated circuit operating in an active state and a sleep state has a power line that is branched through a first transistor to a first virtual power line and through a second transistor to a second virtual power line. The first transistor is switched on in the active state and off in the sleep state; the second transistor is switched off in the active state and on in the sleep state. The first virtual power line powers logic circuits. The second power line powers a memory circuit that stores necessary logic-circuit signal levels during the sleep state. The memory circuit does not consume power in the active state.

17 Claims, 6 Drawing Sheets

SEMICONDUCTOR INTEGRATED CIRCUIT WITH SLEEP MEMORY

BACKGROUND OF THE INVENTION

1. Field of the Invention

The present invention relates to a semiconductor integrated circuit, more particularly to a semiconductor integrated circuit that operates at high speed on a low power supply voltage in an active state, but consumes little power in a sleep state.

2. Description of the Related Art

The increasing levels of integration and performance attained by semiconductor integrated circuits have widened their range of application into areas in which low power consumption is an important consideration. The power consumption of a complementary metal-oxide-semiconductor (CMOS) integrated circuit varies in proportion to the square of its power supply voltage, so the most effective way to reduce power consumption is to lower that voltage. Lowering the power supply voltage, however, reduces the operating speed of metal-oxide-semiconductor (MOS) transistors, unless the transistor threshold voltage is also lowered, and if the transistor threshold voltage is lowered, subthreshold current leakage rises. This leakage greatly increases power consumption in the standby state or sleep state, in which the integrated circuit is powered but is not active.

A solution to this problem is to provide a CMOS integrated circuit with low-threshold transistors for use in the active state, and higher-threshold transistors for preserving necessary data in the sleep state. A multi-threshold CMOS (MTCMOS) circuit of this type is described by S. Shigematsu et al. in "A 1-V High-Speed Circuit Scheme for Power-Down Application Circuits", IEEE J. Solid State Circuits, Vol. 32, No. 6 pp. 861–869 (June 1997), and will be described briefly below.

Referring to FIG. 1, a power-supply circuit (not shown) connected to a power line 1 and a ground line 2 supplies power at a voltage VDD in relation to a ground potential or voltage (GND). A virtual power line 3 and a virtual ground line 4 are also provided. The virtual power line 3 is coupled to the power line 1 through a p-channel MOS (PMOS) transistor 5; the virtual ground line 4 is coupled to the ground line 2 through an n-channel MOS (NMOS) transistor 6. A sleep control signal SL is supplied to the gate of NMOS transistor 6, and through an inverter 7 to the gate of PMOS transistor 5. In the active state, the sleep control signal SL is high, transistors 5 and 6 are switched on, and a virtual power-supply voltage VVDD and virtual ground VGND appear on the virtual power line 3 and virtual ground line 4. Logic circuitry comprising transistors having a low threshold voltage is connected to the virtual power line 3 and virtual ground line 4, and operates at high speed. In the sleep state, the sleep control signal SL is low, transistors 5 and 6 are switched off, and the supply of power to the logic circuitry is halted, thereby also halting current leakage.

If the logic circuitry includes circuits for storing data, the stored data will be lost when the virtual power supply is cut off. If the data must be retained during the sleep state, a separate sleep memory circuit is needed. For data stored in a clocked data storage circuit, it may also be necessary to store the state of the clock signal.

FIG. 2 illustrates a logic circuit for generating a pair of complementary clock signals from a clock input signal, and a first sleep memory circuit for storing the state of the clock input signal.

The logic circuit includes a transmission gate 11 through which the clock input signal CKI is supplied to a node N11. From node N11, the clock signal is output through a cascaded pair of inverters 12, 13. The outputs of the inverters 12 and 13 are denoted /CK and CK, respectively, the slash (/) indicating an inverted signal.

Node N11 is also coupled through a transmission gate 14 to a node N12 in a type of flip-flop 10 comprising inverters 15, 16 and a transmission gate 17, which are interconnected to form a loop. Flip-flop 10 and transmission gate 14 constitute a first sleep memory circuit.

Inverters 12 and 13 comprise low-threshold transistors (not shown) coupled to the virtual power line 3 and virtual ground line 4, whereas inverters 15 and 16 comprise high-threshold transistors coupled to the power line 1 and ground line 2. Transmission gate 14 comprises high-threshold transistors controlled by memory control signals B1 and /B1, whereas the other two transmission gates 11, 17 comprise low-threshold transistors controlled by memory control signals B2 and /B2. The presence of low-threshold transistors in inverters and transmission gates is indicated in the drawings by thick lines on the input side of the circuit symbol.

FIG. 3 illustrates a clocked data storage circuit and a second sleep memory circuit for storing the internal state of the clocked data storage circuit. The clocked data storage circuit is controlled by the clock signals CK, /CK output from inverters 12, 13 in FIG. 2.

The clocked data storage circuit includes a transmission gate 21 that passes input data (IN) to a node N21 connected to the input side of an inverter 22. Inverter 22 is connected in a loop with another inverter 23 and a pair of transmission gates 24, 25 to form a master flip-flop circuit. The output terminal of inverter 22 is connected to a node N22, which is coupled through a transmission gate 26 to a node N23. Node N23 is connected to the input side of an inverter 27, which is connected with an inverter 28 and a pair of transmission gates 29, 30 in another loop, forming a slave flip-flop circuit. A data output signal (OUT) is obtained from the output terminal of inverter 27.

Node N21 is coupled to a node N24 through a series of two transmission gates 31, 32. Node N23 is coupled to node N24 through another series of two transmission gates 33, 34. Node N24 is connected to a flip-flop 20 comprising inverters 35, 36 and a transmission gate 37 interconnected in a loop. Transmission gates 31, 32, 33, 34, and flip-flop 20 constitute a second sleep memory circuit.

Inverters 22, 23, 27, 28 comprise low-threshold transistors coupled to the virtual power line 3 and virtual ground line 4, whereas inverters 35 and 36 comprise high-threshold transistors coupled to the power line 1 and ground line 2. Transmission gates 21, 24, 25, 26, 29, 30, 37 comprise low-threshold transistors, whereas transmission gates 31 to 34 comprise high-threshold transistors. Transmission gates 21, 25, 26, 30, 32, 34 are controlled by clock signals CK, /CK; transmission gates 24, 29, 37 by memory control signals B2, /B2; and transmission gates 31, 33 by memory control signals B1, /B1.

The operation of these prior-art circuits will be described with reference to FIG. 4.

In the active state, the sleep control signal SL is driven high (H) and the memory control signals B1, B2 are driven low (L). Since the sleep control signal SL is high, transistors 5, 6 are switched on, the virtual power-supply voltage VVDD and virtual ground VGND are supplied to the virtual power line 3 and virtual ground line 4, respectively, and logic circuitry such as inverters 12, 13, 22, 23, 27, 28 becomes operational. Since memory control signals B1, B2 are low, transmission gates 14, 17, 31, 33, 37 are switched off, and transmission gates 24, 29 are switched on. Flip-flop 10 is electrically disconnected from node N11 and disabled, flip-flop 20 is electrically disconnected from nodes N21, N23 and disabled, and the flip-flops including inverters 22, 23, 27, 28 are enabled. These flip-flops and other logic circuitry comprising low-threshold transistors operate at high speed, with low power consumption.

In the sleep-in state occurring at a transition from the active state to the sleep state, memory control signal Bi is driven high, switching on transmission gates 14, 31, and 33. The signal at node N11 is transferred to inverter 15 in flip-flop 10, and the signal at either node N21 or N23, depending on the state of the clock signal CK, is transferred to inverter 35 in flip-flop 20.

In the sleep state, the sleep control signal SL and memory control signal B1 are held low and memory control signal B2 is held high; transmission gate 17 is thereby switched on, activating the flip-flop 10 comprising inverters 15, 16; transmission gate 14 is switched off, electrically disconnecting node N12 from node N11; flip-flop 10 therefore retains the last clock signal state to appear at node N12 before the sleep state was entered. Similarly, transmission gate 37 is switched on, activating the flip-flop 20 comprising inverters 35 and 36; transmission gates 31, 33 are switched off, electrically disconnecting node N24 from nodes N21 and N23; flip-flop 20 therefore retains the last signal state to appear at node N24 before the sleep state was entered. At the same time, transistors 5, 6 are switched off so that the virtual power line 3 and virtual ground line 4 are electrically disconnected from power line 1 and ground line 2. The supply of power to logic circuits having low-threshold transistors, such as the circuits including inverters 12, 13, 22, 23, 27, 28, is thereby halted, while flip-flops 10 and 20 continue to receive power from power line 1 and ground line 2.

In the sleep-out state occurring at a transition from the sleep state to the active state, the sleep control signal SL and memory control signals B1, B2 are all driven high; transistors 5, 6 are thereby switched on, the virtual power-supply voltage VVDD and virtual ground VGND are coupled to the virtual power line 3 and virtual ground line 4, and all logic circuitry becomes operational. Further, in addition to the transmission gates 17, 37 in flip-flops 10, 20, transmission gates 14, 31, 33 are switched on, so the clock signal state held in flip-flop 10 is output to node N11, and the internal data state held in flip-flop 20 is output to either node N21 or N23, depending on the clock signal state. After that, memory control signals B1, B2 are driven low, initiating the active state.

The prior art described above achieves high-speed operation in the active state by using low-threshold transistors in the logic circuitry powered from the virtual power-supply voltage VVDD and virtual ground VGND. In the sleep state, current leakage is greatly reduced by cutting off power to these low-threshold transistors, and retaining necessary data and clock states in flip-flops 10, 20 with high-threshold transistors.

A problem with the prior art is that, although it reduces power consumption in the sleep state, it increases power consumption slightly in the active state. The reason is that although flip-flops 10, 20 operate only during the sleep state (and the transitional sleep-in and sleep-out states), they are powered at all times. Despite their relatively high threshold voltage, a certain amount of subthreshold current still leaks through the transistors in inverters 15, 16, 35, 36 in the active state, from VDD to GND. It would be desirable to avoid the resulting increased power consumption in the active state, especially if there are many clock states and data to be retained in the sleep state, requiring a large number of flip-flops 10, 20.

SUMMARY OF THE INVENTION

An object of the present invention is to enable high-speed operation to be achieved in the active state and current leakage to be reduced in the sleep state without increasing current leakage in the active state.

The invented semiconductor integrated circuit operates in an active state, a sleep state, a sleep-in state occurring at a transition from the active state to the sleep state, and a sleep-out state occurring at a transition from the sleep state to the active state. A power line supplies power in all four of these states. A first MOS transistor, having a first threshold voltage, couples the power line to a first virtual power line in the active state, the sleep-in state, and the sleep-out state. A second MOS transistor, having a second threshold voltage, couples the power line to a second virtual power line in the sleep state, the sleep-in state, and the sleep-out state. The second threshold voltage may be substantially equal to the first threshold voltage.

The first virtual power line powers a logic circuit, which may have transistors with threshold voltages lower than the first threshold voltage. The second virtual power line powers a memory circuit, which may have transistors with threshold voltages substantially equal to the first threshold voltage. The memory circuit stores the level of a node in the logic circuit during the sleep state.

Since the second MOS transistor is switched off in the active state, the memory circuit does not consume power in the active state. The invented semiconductor integrated circuit therefore consumes less power in the active state than is consumed in the prior art. The invented semiconductor integrated circuit can also provide the prior-art advantages of low-voltage, high-speed operation in the active state and low leakage current in the sleep state.

DETAILED DESCRIPTION OF THE INVENTION

Figure 1:
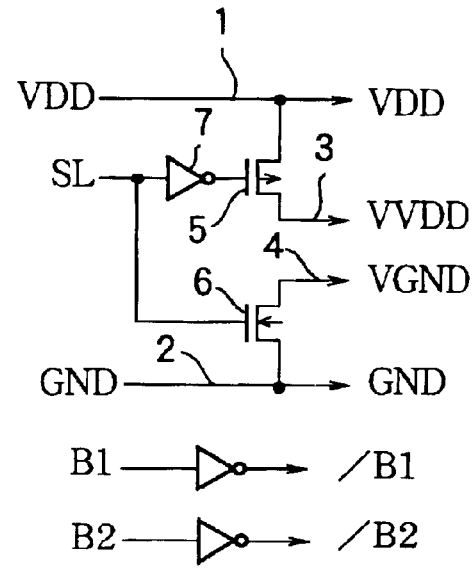
FIGS. 1, 2, and 3 illustrate conventional MTCMOS circuitry.

Two embodiments of the invention will now be described with reference to the attached drawings, in which like elements are indicated by like reference characters. Both embodiments are MTCMOS semiconductor integrated circuits in which the prior art described above is modified according to the present invention to reduce power consumption in the active state.

First Embodiment

Figure 5:
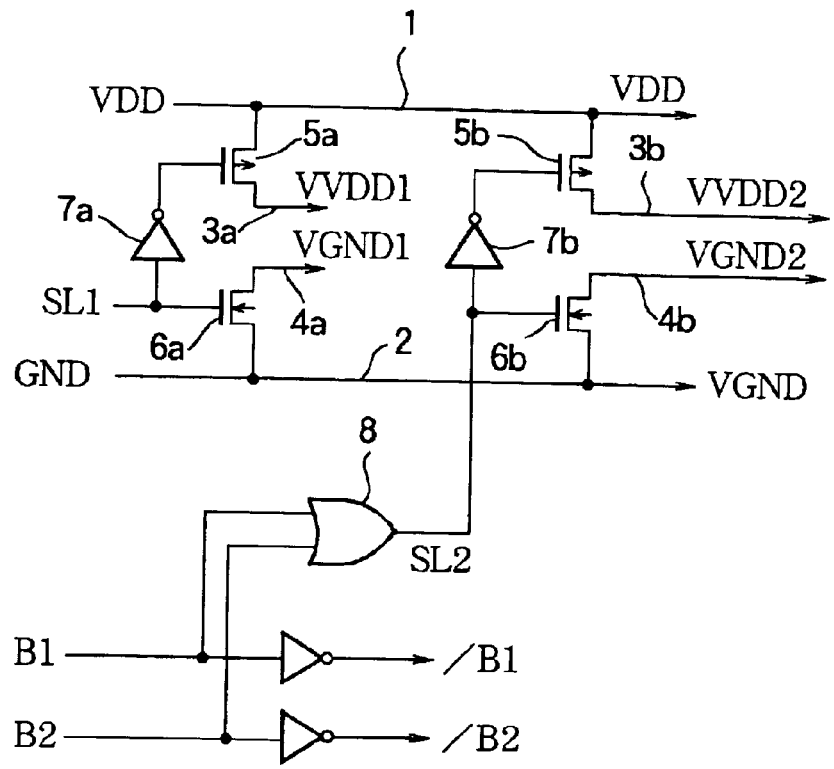
FIGS. 5, 6, and 7 illustrate MTCMOS circuitry in a first embodiment of the invention.

Referring to FIG. 5, the first embodiment has a power line 1 and a ground line 2 to which a power supply voltage VDD and ground voltage GND are supplied by a power supply circuit (not shown), a first virtual power line 3a and a first virtual ground line 4a that supply a first virtual power supply voltage VVDD1 and a first virtual ground voltage VGND1 to logic circuitry comprising transistors having a relatively low threshold voltage, and a second virtual power line 3b and a second virtual ground line 4b that supply a second virtual power supply voltage VVDD2 and a second virtual ground voltage VGND2 to memory circuits that store clock levels during the sleep state.

The first virtual power line 3a is coupled to power line 1 through a PMOS transistor 5a, and the first virtual ground line 4a is coupled to ground line 2 through an NMOS transistor 6a; these transistors 5a, 6a, which are used for sleep state control, have a relatively high first threshold voltage. A sleep control signal SL1 is supplied to the gate of NMOS transistor 6a, and through an inverter 7a to the gate of PMOS transistor 5a.

Similarly, the second virtual power line 3b is coupled to power line 1 through a PMOS transistor 5b, and the second virtual ground line 4b is coupled to ground line 2 through an NMOS transistor 6b. These transistors 5b, 6b, which are also used for sleep state control, have a relatively high second threshold voltage, such as a threshold voltage substantially equal to the first threshold voltage. A sleep control signal SL2, which is obtained from an OR gate 8 as the logical OR of memory control signals B1 and B2, is supplied to the gate of NMOS transistor 6b, and through an inverter 7b to the gate of PMOS transistor 5b.

Figure 6:
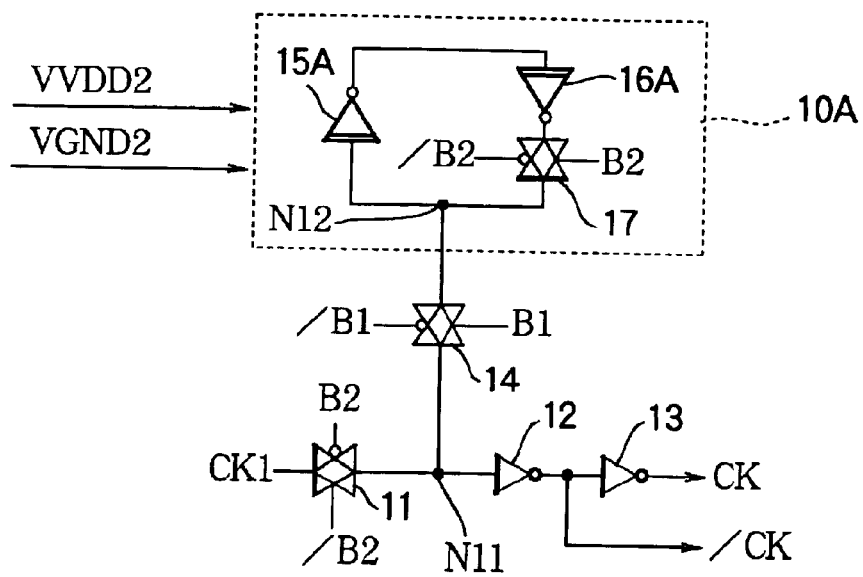

FIG. 6 illustrates a logic circuit for generating a pair of complementary clock signals from a clock input signal, and a first sleep memory circuit for storing the state of the clock input signal.

The logic circuit is identical to the corresponding circuit in the prior art, including a transmission gate 11 through which the clock signal CKI is supplied to a node N11, and a pair of CMOS inverters 12, 13 with outputs denoted /CK and CK, respectively. Inverter 13 receives input from inverter 12, which receives input from node N11. Inverters 12 and 13 comprise transistors (not shown) coupled to the first virtual power line 3a and first virtual ground line 4a; these transistors have the relatively low threshold voltage mentioned above.

Node N11 is also coupled through a transmission gate 14 to a node N12 in a flip-flop 10A comprising CMOS inverters 15A, 16A and a transmission gate 17, interconnected to form a loop. Inverters 15A and 16A comprise transistors (not shown) having a relatively high threshold voltage, such as the first or second threshold voltage mentioned above. Differing from the corresponding inverters 15, 16 in the prior art, inverters 15A and 16A are powered from the second virtual power line 3b and second virtual ground line 4b. More specifically, each of these inverters 15A, 16A comprises a PMOS transistor and an NMOS transistor coupled in series between the second virtual power line 3b and second virtual ground line 4b.

To achieve maximum reduction of power consumption, the transistors 5b, 6b that control the second virtual power line 3b and second virtual ground line 4b may be designed to leak even less subthreshold current than the transistors in inverters 15A, 16A. For example, transistors 5b, 6b may have a narrower gate width, longer gate length, and/or higher threshold voltage than the transistors in inverters 15A, 16A.

As in the prior art, transmission gate 14 comprises high-threshold transistors controlled by memory control signals B1 and /B1, whereas transmission gates 11, 17 comprise low-threshold transistors controlled by memory control signals B2 and /B2.

Figure 2:
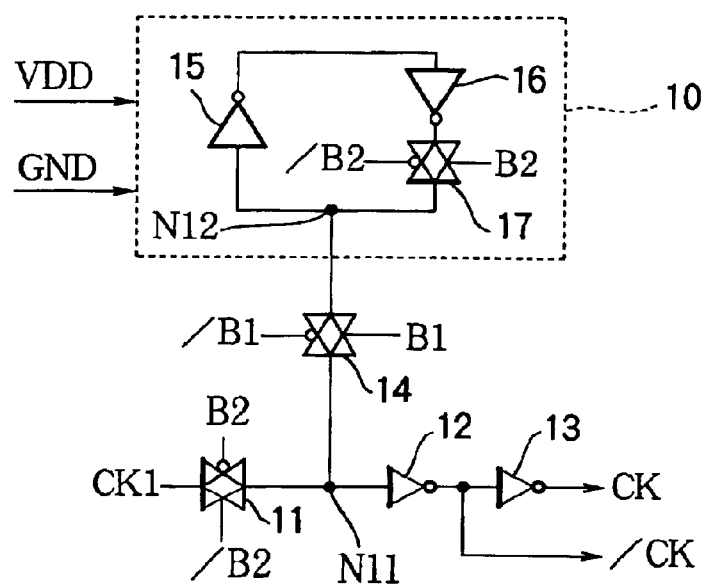
Figure 3:
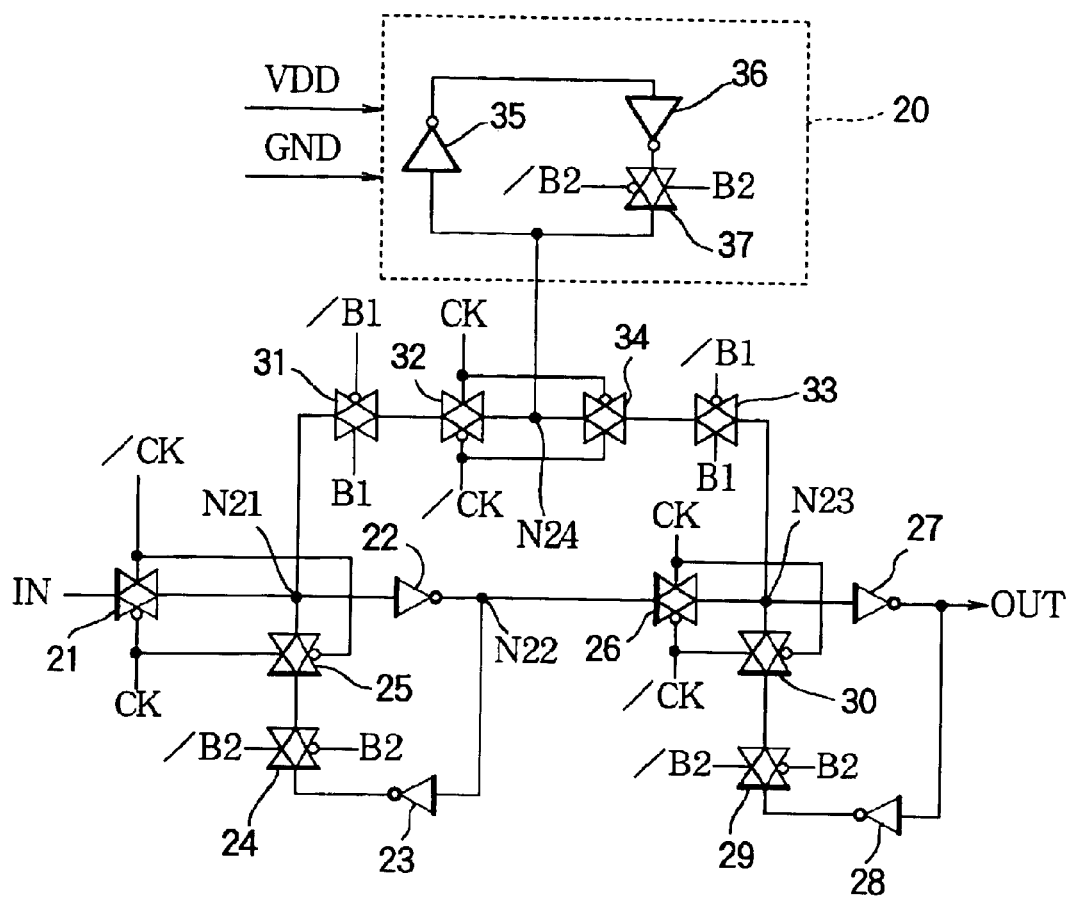
Figure 4:
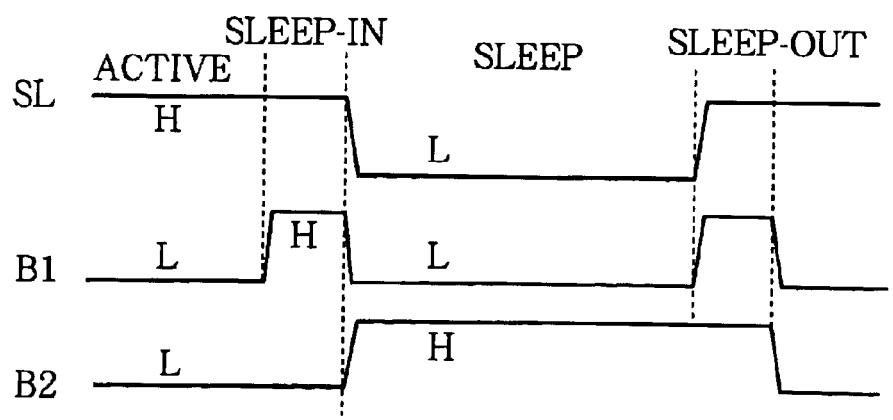
FIG. 4 schematically shows waveforms of the control signals in FIGS. 1, 2, and 3.
Figure 7:
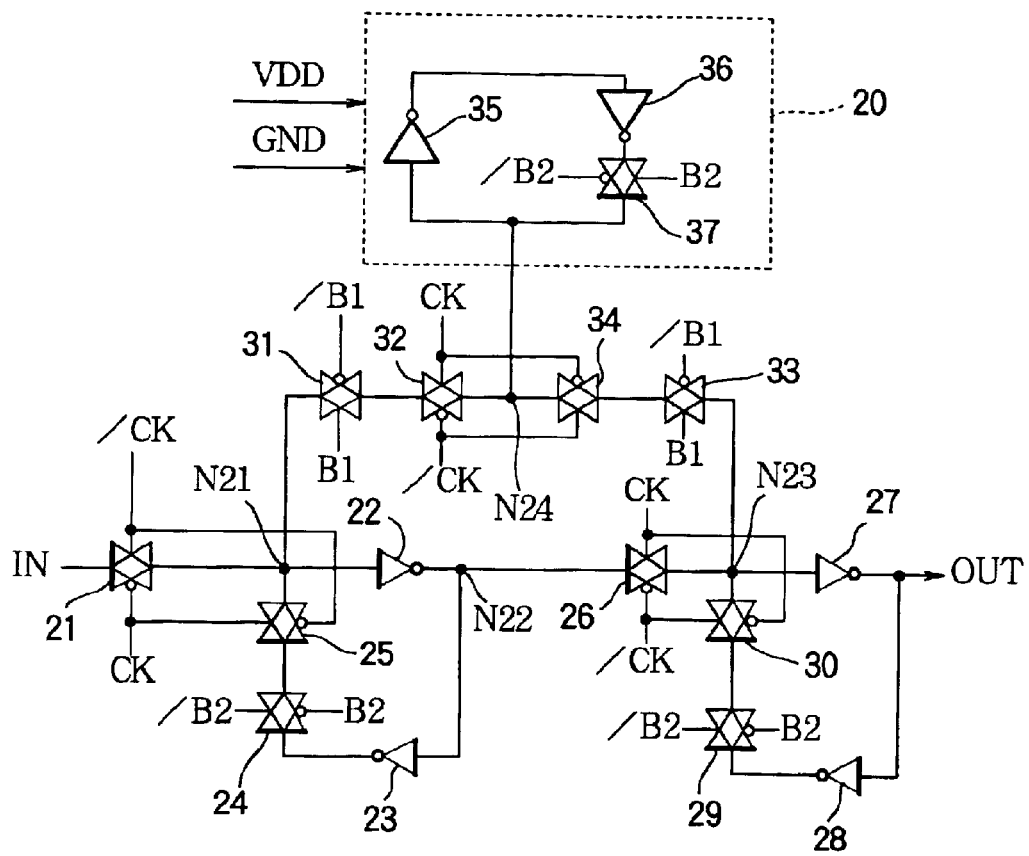

FIG. 7 illustrates a clocked data storage circuit controlled by the clock signals CK, /CK output from inverters 12, 13 in FIG. 2, and a second sleep memory circuit for storing the internal state of the clocked data storage circuit.

The clocked data storage circuit is identical to the corresponding circuit in the prior art, having a transmission gate 21 that passes input data (IN) to a node N21 in a master flip-flop comprising a pair of CMOS inverters 22, 23 and a pair of transmission gates 24, 25 coupled in a loop, and a transmission gate 26 that passes data from a node N22 to a node N23 in a slave flip-flop comprising a pair of CMOS inverters 27, 28 and a pair of transmission gates 29, 30 coupled in another loop. Node 21 is connected to the input terminal of inverter 22; node N22 is connected to the output terminal of inverter 22; node N23 is connected to the input terminal of inverter 27; a data output signal (OUT) is obtained from the output terminal of inverter 27.

As in the prior art, nodes N21 and N23 are coupled to a node N24 through a series of two transmission gates 31, 32 and a series of two transmission gates 33, 34, respectively. Node N24 is connected to a flip-flop 20 comprising CMOS inverters 35, 36 and a transmission gate 37 that are interconnected in a loop. Transmission gates 31, 32, 33, 34, and flip-flop 20 constitute a second sleep memory circuit.

Inverters 22, 23, 27, and 28 comprise relatively low-threshold transistors (not shown) coupled to the first virtual power line 3a and first virtual ground line 4a; inverters 35 and 36 comprise relatively high-threshold transistors (not shown) coupled to the power line 1 and ground line 2. Transmission gates 21, 24, 25, 26, 29, 30, 37 comprise relatively low-threshold transistors, whereas transmission gates 31 to 34 comprise relatively high-threshold transistors. Transmission gates 21, 25, 26, 30, 32, 34 are controlled by clock signals CK, /CK; transmission gates 24, 29, 37 by memory control signals B2, /B2; and transmission gates 31, 33 by memory control signals B1, /B1.

The integrated circuit in the first embodiment may have an arbitrary number of memory circuits of the types shown in FIGS. 6 and 7, to store necessary clock levels and other signal levels in the sleep state.

Figure 8:
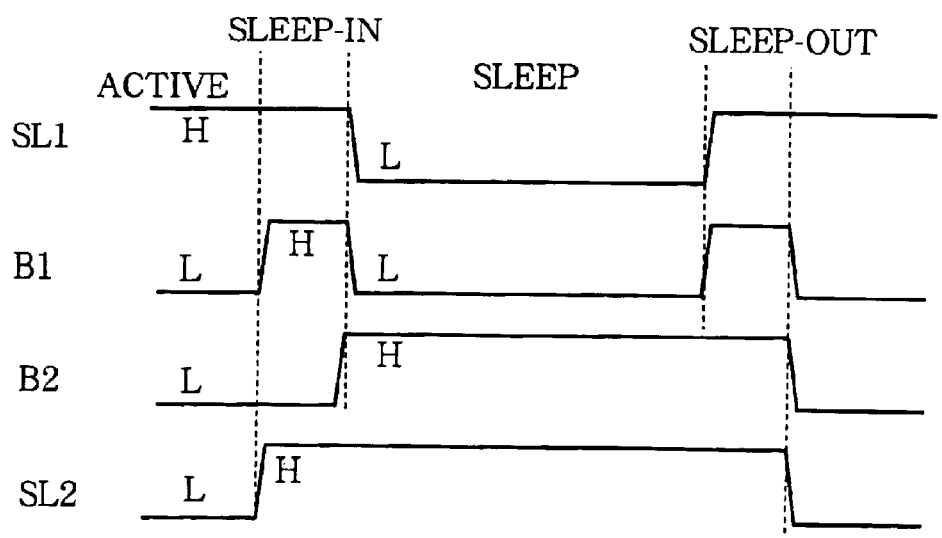
FIG. 8 schematically shows waveforms of the control signals in FIGS. 5, 6, and 7.

The operation of the circuits shown in FIGS. 5, 6, and 7 will be described below with reference to the waveforms in FIG. 8.

In the active state, sleep control signal SL1 is driven high (H) and the memory control signals B1, B2 are driven low (L); the sleep control signal SL2 output from OR gate 8 is therefore low. Since sleep control signal SL1 is high, transistors 5a, 6a are switched on, supplying the virtual power-supply voltage VVDD1 and virtual ground VGND1 to the first virtual power line 3a and first virtual ground line 4a, respectively. Since sleep control signal SL2 is low, transistors 5b, 6b are switched off, and the second virtual power line 3b and second virtual ground line 4b are electrically disconnected from the power line 1 and ground line 2. The supply of power to flip-flop 10A is thereby halted, while power is supplied to other logic and memory circuits. The memory control signals B1, B2 are low, so transmission gates 14, 17, 31, 33, 37 are switched off and transmission gates 11, 24, 29 are switched on. Since transmission gates 31 and 33 are switched off, flip-flop 20 is electrically disconnected from nodes N21, N23, and does not operate. The only operational circuits are the logic circuits powered by the first virtual power-supply voltage VVDD1 and virtual ground VGND1, such as inverters 12, 13, 22, 23, 27, 28, which comprise low-threshold transistors and operate at high speed with low power consumption.

In the sleep-in state occurring at a transition from the active state to the sleep state, memory control signal B1 is driven high but the other control signals SL1, B2 are left unchanged. The sleep control signal SL2 output from OR gate 8 now goes high, so the second virtual power supply VVDD2 and virtual ground VGND2 are supplied to flip-flop 10A. Since memory control signal B1 is high, transmission gates 14, 31, 33 are switched on, the signal at node N11 is transferred to inverter 15A in flip-flop 10A, and the signal at either node N21 or N23, depending on the state of clock signal CK, is transferred to inverter 35 in flip-flop 20.

In the sleep state, sleep control signal SL1 and memory control signal B1 are held low and memory control signal B2 is held high. Sleep control signal SL2, which is output from OR gate 8, remains high. Transmission gate 17 is now switched on, activating the flip-flop 10A comprising inverters 15A, 16A; transmission gate 14 is switched off, electrically disconnecting node N12 from node N11. Flip-flop 10A therefore retains the last clock signal state to appear at node N12 before the sleep state was entered. To ensure that the correct clock state is stored, the control signal transitions are sequenced so that first memory control signal B2 is driven high; then memory control signal B1 is driven low; and finally sleep control signal SL1 is driven low. Accordingly, first transmission gate 11 is switched off and transmission gate 17 is switched on, transferring the driving of node N12 from the clock input signal CLKI to inverter 16A; next transmission gate 14 is switched off; and finally transistors 5a, 6a are switched off, disconnecting the first virtual power line 3a and first virtual ground line 4a from power line 1 and ground line 2.

Similarly, transmission gate 37 is switched on in the sleep state, activating flip-flop 20; transmission gates 31, 33 are switched off so that node N24 is electrically disconnected from nodes N21 and N23; flip-flop 20 therefore retains the last signal state to appear at node N24 before the sleep state was entered. The control signal timing described above also ensures that this storing operation is carried out correctly: first transmission gate 37 is switched on; next, transmission gates 31 and 33 are switched off; and then the first virtual power line 3a and first virtual ground line 4a are electrically disconnected, deactivating inverters 12, 13 and halting output of clock signals CK and /CK.

In the sleep state, the power supply to all logic circuits having low-threshold transistors is halted, while flip-flop 20 continues to receive power from power line 1 and ground line 2 and flip-flop 10A continues to receive power from the second virtual power line 3b and second virtual ground line 4b. Both flip-flops 10A and 20 thus retain the last signal levels received before the sleep state was entered.

In the sleep-out state occurring at a transition from the sleep state to the active state, sleep control signal SL1 and memory control signals B1, B2 are all driven high. Transistors 5a, 6a are thereby switched on, and the first virtual power line 3a and first virtual ground line 4a supply the first virtual power-supply voltage VVDD1 and virtual ground VGND1 to logic circuitry such as inverters 12, 13, 22, 23, 27, 28. The second virtual power line 3b and second virtual ground line 4b continue to supply the second virtual power-supply voltage VVDD2 and virtual ground VGND2, since sleep control signal SL2, which is output from OR gate 8, remains high. The transmission gates 17, 37 in flip-flops 10A, 20 remain switched on, and transmission gates 14, 31, 33 are also now switched on, so all logic and memory circuits are operational. The clock signal state retained in flip-flop 10A is output to node N11, and the data signal state retained in flip-flop 20 is output to either node N21 or N23, depending on the clock state, and the flip-flops including inverters 22, 23, 27, 28 operate according to these clock and data signal states.

Next, memory control signals B1, B2 are driven low, initiating the active state. In the transition from the sleep-out state to the active state, to ensure that the signal retained in flip-flop 10A is output correctly to node N11, memory control signal B2 is driven low before memory control signal B1, so that first transmission gate 11 is switched on and transmission gate 17 is switched off; then transmission gate 14 is switched off and the second virtual power line 3b and second virtual ground line 4b are electrically disconnected. This sequence ensures that node N11 is always driven by either flip-flop 10A or the clock input signal CLKI, and is never left floating.

As described above, according to the semiconductor integrated circuit of the first embodiment, flip-flops 10A and 20, both comprising transistors with relatively high threshold voltages, retain necessary data during the sleep state when the first virtual power-supply voltage VVDD1 and virtual ground VGND1 are disconnected, but whereas flip-flop 20 is powered from the power-supply voltage VDD and ground voltage GND, flip-flop 10A is powered from the second virtual power-supply voltage VVDD2 and virtual ground VGND2, and receives power only during the sleep-in state, sleep state, and sleep-out state. As in the prior art, current leakage in the sleep state is reduced by storing signal levels in memory circuits with high-threshold transistors, and high-speed operation is achieved in the active state by using logic circuits with low-threshold transistors. In addition, less power is consumed than in the prior art, because the power supply to flip-flop 10A is cut off in the active state.

Second Embodiment

Figure 9:
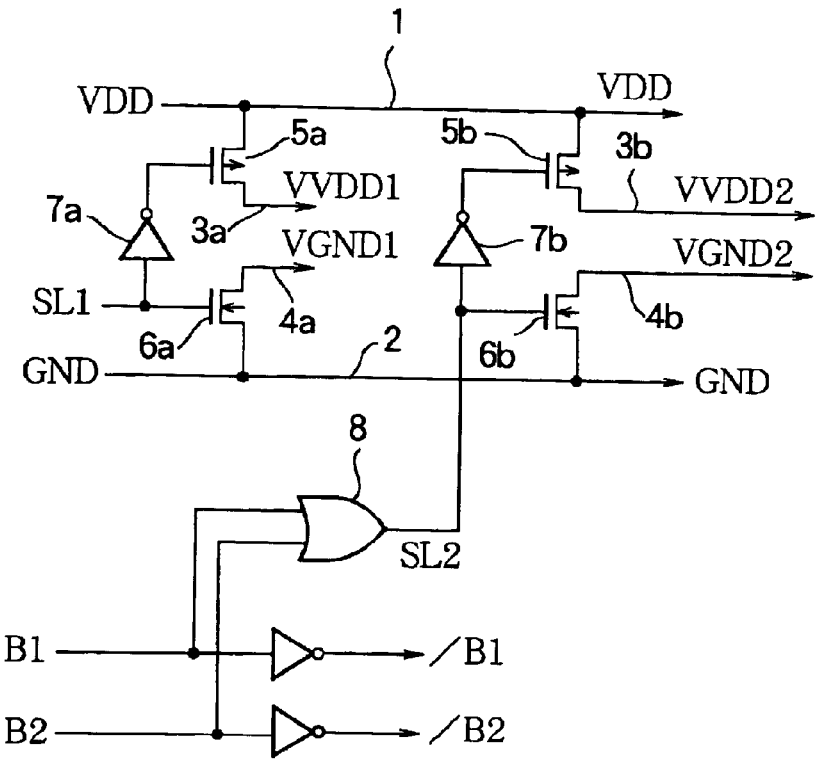
FIGS. 9, 10, and 11 illustrate MTCMOS circuitry in a second embodiment of the invention.
Figure 10:
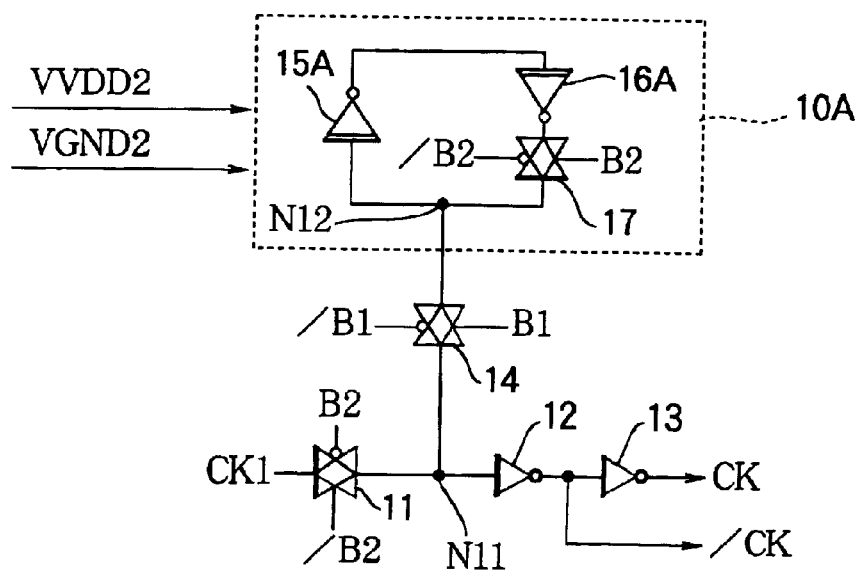
Figure 11:
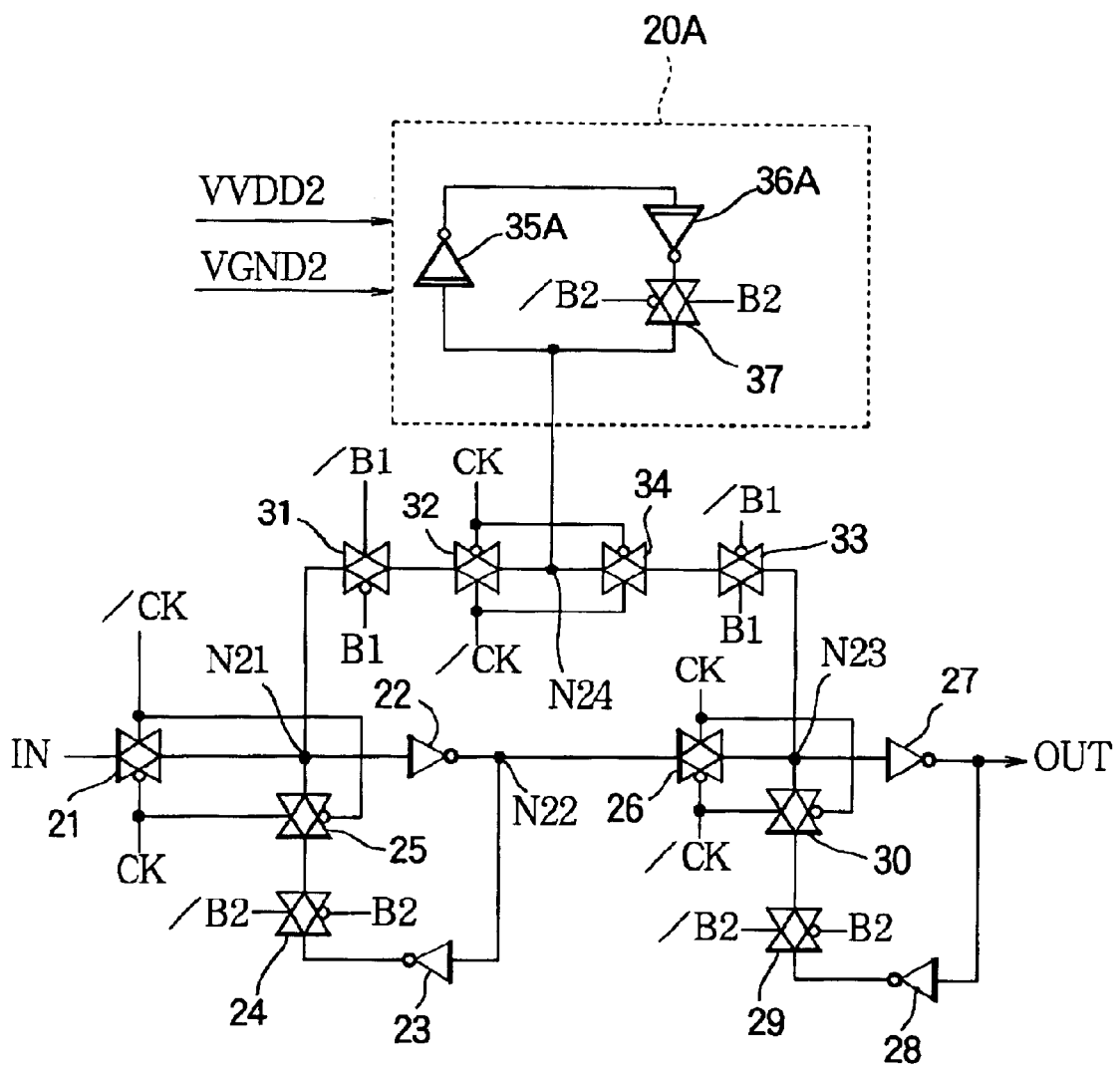

FIGS. 9 to 11 illustrate a second embodiment of the invented semiconductor integrated circuit, in which flip-flop 20 in FIG. 7 is replaced by a flip-flop 20A, shown in FIG. 11. This flip-flop 20A is similar to flip-flop 10A in that it is powered from the second virtual power-supply voltage VVDD2 and virtual ground VGND2. Inverters 35A and 36A comprise transistors (not shown) with relatively high threshold voltages, connected to the VVDD2 and VGND2 lines 3b, 4b. The other circuit elements in FIGS. 9 to 11 are the same as the corresponding circuit elements in FIGS. 5 to 8.

The second virtual power-supply voltage VVDD2 and virtual ground VGND2 are supplied to flip-flop 20A during the sleep-in state, the sleep state, and sleep-out state, but are halted in the active state. Flip-flop 20A is therefore inactive in the active state and active in the other states, storing the last data before the sleep state was entered, retaining the stored data in the sleep state, outputting the retained data in the sleep-out state, and leaking no current in the active state.

In the second embodiment, flip-flops 10A, 20A retain necessary data during the sleep state when the first virtual power-supply voltage VVDD1 and virtual ground VGND1 are disconnected. As in the first embodiment, current leakage is reduced in the sleep state because flip-flops 10A, 20A comprise high-threshold transistors, high-speed operation is achieved in the active state because inverters 12, 13, 22, 23, 27, 28 and other logic circuits (not shown) comprise low-threshold transistors, and power consumption is reduced in the active state because flip-flop 10A is not powered. Compared with the first embodiment, power consumption in the active state is further reduced because flip-flop 20A is not powered either.

The present invention is not limited to the embodiments above; these embodiments can be modified in various ways, including but not limited to the following.

(a) The circuit configurations of the flip-flops 10A, 20, 20A in the sleep memory circuits can be modified, and the logic circuits to which these sleep memory circuits are coupled are not limited to the clock generating circuit and clocked data storage circuit shown in the embodiments. It suffices to connect a sleep memory circuit comprising relatively high-threshold transistors to each logic circuit node that must exit the sleep state in the state it had on entering the sleep state; to power these sleep memory circuits during the sleep state and the transitional states; and to switch off power to at least one of these sleep memory circuits during the active state.

(b) The virtual ground lines 4a, 4b and their driving transistors 6a, 6b can be eliminated, and ground line 2 can be connected directly to the circuits to be powered. The invention can then be realized in a smaller area.

Those skilled in the art will recognize that further variations are possible within the scope of the appended claims.

What is claimed is:

1. A semiconductor integrated circuit operating in an active state, a sleep state, a sleep-in state occurring at a transition from the active state to the sleep state, and a sleep-out state occurring at a transition from the sleep state to the active state, comprising:
    a power line supplying power in the active state, the sleep state, the sleep-in state, and the sleep-out state;
    a first virtual power line;
    a first metal-oxide-semiconductor (MOS) transistor having a first threshold voltage, coupling the power line to the first virtual power line in the active state, the sleep-in state, and the sleep-out state;
    a second virtual power line;
    a second MOS transistor having a second threshold voltage, coupling the power line to the second virtual power line in the sleep state, the sleep-in state, and the sleep-out state;
    a logic circuit, powered from the first virtual power line, having at least one node; and
    a memory circuit, powered from the second virtual power line, for storing a level of said at least one node in the sleep state.

2. The semiconductor integrated circuit of claim 1, wherein the memory circuit includes:
    at least one flip-flop activated by a first memory control signal; and
    at least one transmission gate activated by a second memory control signal, for coupling said at least one flip-flop to said at least one node.

3. The semiconductor integrated circuit of claim 2, further comprising a logic gate generating a sleep control signal from the first memory control signal and the second memory control signal, the sleep control signal switching the second MOS transistor on and off.

4. The semiconductor integrated circuit of claim 1, wherein the logic circuit comprises transistors with threshold voltages lower than the first threshold voltage.

5. The semiconductor integrated circuit of claim 1, wherein the memory circuit comprises transistors with threshold voltages substantially equal to the first threshold voltage.

6. The semiconductor integrated circuit of claim 1, wherein the second threshold voltage is substantially equal to the first threshold voltage.

7. The semiconductor integrated circuit of claim 1, wherein the second threshold voltage is higher than the threshold voltages of the transistors in the memory circuit.

8. The semiconductor integrated circuit of claim 1, wherein the logic circuit includes a clocked data storage circuit.

9. The semiconductor integrated circuit of claim 8, wherein said at least one node is a clock signal node from which a clock signal is supplied to the data storage circuit.

10. The semiconductor integrated circuit of claim 8, wherein the memory circuit stores a data signal level obtained from the data storage circuit, and a clock signal level of a clock signal supplied to the data storage circuit.

11. A semiconductor integrated circuit operating in an active state, a sleep state, a sleep-in state occurring at a transition from the active state to the sleep state, and a sleep-out state occurring at a transition from the sleep state to the active state, comprising:
    a power line supplying power in the active state, the sleep state, the sleep-in state, and the sleep-out state;
    a first virtual power line;
    a first MOS transistor having a first threshold voltage, coupling the power line to the first virtual power line in the active state, the sleep-in state, and the sleep-out state;
    a second virtual power line;
    a second MOS transistor having a second threshold voltage, coupling the power line to the second virtual power line in the sleep state, the sleep-in state, and the sleep-out state;
    a logic circuit, powered from the first virtual power line, including at least one clocked data storage circuit operating according to a clock signal and a data input signal and generating a data output signal;
    a first memory circuit, powered from the second virtual power line, for storing a level of the clock signal in the sleep state; and
    a second memory circuit powered from the power line, for storing a level of the data input signal or the data output signal in the sleep state.

12. The semiconductor integrated circuit of claim 11, wherein the logic circuit includes transistors with threshold voltages lower than the first threshold voltage.

13. The semiconductor integrated circuit of claim 11, wherein the first memory circuit and the second memory circuit include transistors with threshold voltages substantially equal to the first threshold voltage.

14. The semiconductor integrated circuit of claim 11, wherein the second threshold voltage is substantially equal to the first threshold voltage.

15. The semiconductor integrated circuit of claim 11, wherein the second threshold voltage is higher than the threshold voltages of the transistors in the first memory circuit.

16. The semiconductor integrated circuit of claim 11, wherein the first memory circuit comprises:
    a first transmission gate supplying the clock signal to a first node;
    a first inverter having an input terminal and an output terminal, the input terminal of the first inverter being coupled to the first node, the first inverter being powered from the second virtual power line;

a second inverter having an input terminal and an output terminal, the input terminal of the second inverter being coupled to the output terminal of the first inverter, the second inverter being powered from the second virtual power line; and a second transmission gate coupling the output terminal of the second inverter to the first node.

17. The semiconductor integrated circuit of claim 16, wherein the second memory circuit comprises:

a third transmission gate supplying the data input signal to a second node;

a fourth transmission gate supplying the data output signal to the second node;

a third inverter having an input terminal and an output terminal, the input terminal of the third inverter being coupled to the second node, the third inverter being powered from the power line;

a fourth inverter having an input terminal and an output terminal, the input terminal of the fourth inverter being coupled to the output terminal of the third inverter, the fourth inverter being powered from the power line; and a fifth transmission gate coupling the output terminal of the fourth inverter to the second node.

* * * * *